US006406994B1

(12) United States Patent
Ang et al.

(10) Patent No.: US 6,406,994 B1
(45) Date of Patent: Jun. 18, 2002

(54) TRIPLE-LAYERED LOW DIELECTRIC CONSTANT DIELECTRIC DUAL DAMASCENE APPROACH

(75) Inventors: Ting Cheong Ang, Singapore (SG); Shyue Fong Quek, Petaling Jaya; Yee Chong Wong, J.B., both of (ML); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 41 days.

(21) Appl. No.: 09/726,657

(22) Filed: Nov. 30, 2000

(30) Foreign Application Priority Data

Dec. 3, 1999 (JP) ........................................ 11-344554

(51) Int. Cl.[7] ........................................ H01L 21/44

(52) U.S. Cl. ........................ 438/637; 438/622; 438/624; 438/638

(58) Field of Search ........................ 438/622, 624, 438/637, 638, 618, 642, 641

(56) References Cited

U.S. PATENT DOCUMENTS

| | | | | |
|---|---|---|---|---|
| 5,635,423 A | | 6/1997 | Huang et al. | 437/195 |
| 5,741,626 A | | 4/1998 | Jain et al. | 430/314 |
| 5,798,302 A | | 8/1998 | Hudson et al. | 438/693 |
| 5,801,094 A | | 9/1998 | Yew et al. | 438/624 |
| 5,877,076 A | | 3/1999 | Dai | 438/597 |
| 5,935,762 A | | 8/1999 | Dai et al. | 430/312 |
| 6,159,845 A | * | 12/2000 | Yew et al. | 438/619 |
| 6,207,576 B1 | * | 3/2001 | Wang et al. | 438/706 |
| 6,271,084 B1 | * | 8/2001 | Tu et al. | 438/240 |
| 6,281,135 B1 | * | 8/2001 | Han et al. | 438/725 |
| 6,313,028 B2 | * | 11/2001 | Huang et al. | 438/597 |
| 6,326,300 B1 | * | 12/2001 | Liu | 438/638 |
| 6,331,479 B1 | * | 12/2001 | Li et al. | 438/618 |
| 6,350,675 B1 | * | 2/2002 | Chooi et al. | 438/624 |

OTHER PUBLICATIONS

Chang et al., "ULSI Technology", The McGraw Hill Companies, Inc., NY, NY, c.1996, pp. 444–445.

* cited by examiner

*Primary Examiner*—Kevin M. Picardat
(74) *Attorney, Agent, or Firm*—George O. Saile; Rosemary L. S. Pike

(57) ABSTRACT

A triple layered low dielectric constant material dual damascene metallization process is described. Metal lines are provided covered by an insulating layer overlying a semiconductor substrate. A first dielectric layer of a first type is deposited overlying the insulating layer. A second dielectric layer of a second type is deposited overlying the first dielectric layer. A via pattern is etched into the second dielectric layer. Thereafter, a third dielectric layer of the first type is deposited overlying the patterned second dielectric layer. Simultaneously, a trench pattern is etched into the third dielectric layer and the via pattern is etched into the first dielectric layer to complete the formation of dual damascene openings in the fabrication of an integrated circuit device. If the first type is a low dielectric constant organic material, the second type will be a low dielectric constant inorganic material. If the first type is a low dielectric constant inorganic material, the second type will be a low dielectric constant organic material.

20 Claims, 5 Drawing Sheets

TRIPLE-LAYERED LOW DIELECTRIC CONSTANT DIELECTRIC DUAL DAMASCENE APPROACH

RELATED PATENT APPLICATION

U.S. patent application Ser. No. 09/845,480 to T. C. Ang et al.

BACKGROUND OF THE INVENTION (1) Field of the Invention

The invention relates to a method of metallization in the fabrication of integrated circuits, and more particularly, to a method of dual damascene metallization using low dielectric constant materials in the manufacture of integrated circuits.

(2) Description of the Prior Art

The damascene or dual damascene process has become a future trend in integrated circuit manufacturing, especially in the copper metallization process. These processes are discussed in *ULSI Technology*, by Chang and Sze, The McGraw Hill Companies, Inc., NY, N.Y., c. 1996, pp. 444–445. Low dielectric constant materials have been proposed as the dielectric materials in order to reduce capacitance. In the conventional damascene scheme, one or more etch stop and/or barrier layers comprising high dielectric constant materials, such as silicon nitride, are required. This defeats the purpose of the low dielectric constant materials. It is desired to find a process which does not require a high dielectric constant etch stop/barrier layer.

U.S. Pat. No. 5,635,423 to Huang et al teaches various methods of forming a dual damascene opening. An etch stop layer such as silicon nitride or polysilicon is used. This is the conventional approach to dual damascene structure, with no consideration for dielectric constant value. U.S. Pat. Nos. 5,935,762 to Dai et al and 5,877,076 to Dai show a double mask self-aligned process using a silicon nitride etch stop layer. U.S. Pat. No. 5,798,302 to Hudson et al shows a damascene process. U.S. Pat. No. 5,741,626 to Jain et al discloses a dual damascene process using a tantalum nitride etch stop layer. U.S. Pat. No. 5,801,094 to Yew et al teaches a self-aligned process using a silicon nitride etch stop layer.

SUMMARY OF THE INVENTION

A principal object of the present invention is to provide an effective and very manufacturable method of metallization in the fabrication of integrated circuit devices.

Another object of the invention is to provide a dual damascene metallization process using low dielectric constant materials.

Yet another object of the invention is to provide a dual damascene metallization process using low dielectric constant materials without using a high dielectric constant etch stop material.

A further object of the invention is to provide a triple layered low dielectric constant material dual damascene metallization process.

In accordance with the objects of this invention a triple layered low dielectric constant material dual damascene metallization process is achieved. Metal lines are provided covered by an insulating layer overlying a semiconductor substrate. A first dielectric layer of a first type is deposited overlying the insulating layer. A second dielectric layer of a second type is deposited overlying the first dielectric layer. A via pattern is etched into the second dielectric layer. Thereafter, a third dielectric layer of the first type is deposited overlying the patterned second dielectric layer. Simultaneously, a trench pattern is etched into the third dielectric layer and the via pattern is etched into the first dielectric layer to complete the formation of dual damascene openings in the fabrication of an integrated circuit device. If the first type is a low dielectric constant organic material, the second type will be a low dielectric constant inorganic material. If the first type is a low dielectric constant inorganic material, the second type will be a low dielectric constant organic material.

BRIEF DESCRIPTION OF THE DRAWINGS

In the accompanying drawings forming a material part of this description, there is shown:

FIGS. 1 through 8 schematically illustrate in cross-sectional representation a dual damascene process of the present invention.

DESCRIPTION OF THE PREFERRED EMBODIMENTS

The present invention provides a triple-layered low dielectric constant material self-aligned dual damascene process. A high dielectric constant material etch stop/barrier layer is not required in the process of the present invention.

Figure 1:
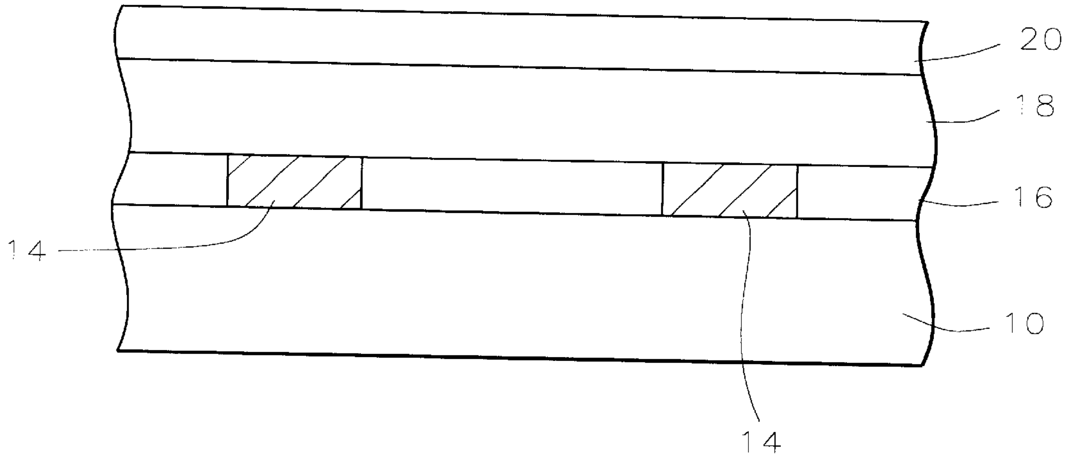

Referring now more particularly to FIG. 1, there is illustrated a portion of a partially completed integrated circuit device. There is shown a semiconductor substrate 10, preferably composed of monocrystalline silicon. Semiconductor device structures, such as gate electrodes, source and drain regions, and metal interconnects, not shown, are formed in and on the semiconductor substrate and covered with an insulating layer. Interconnection lines, such as tungsten, copper or aluminum-copper lines 14, for example, are formed over the insulating layer and will contact some of the underlying semiconductor device structures through openings in the insulating layer, not shown.

Now, a passivation or barrier layer 16 is formed over the metal lines and planarized. Now, the key features of the present invention will be described. A first dielectric layer 18 is deposited over the barrier layer 16 to a thickness of between about 6000 and 20,000 Angstroms. This dielectric layer 18 comprises a low dielectric constant organic material, such as polyimides, HOSP, SILK, FLARE, BCB, methylsilsesquioxane (MSQ), or any organic polymers. The dielectric constant should be less than about 3.5.

Next, a second low dielectric layer 20 is deposited to a thickness of between about 1000 and 10,000 Angstroms. The second dielectric layer 20 comprises a low dielectric constant inorganic material, such as Black Diamond, CORAL, fluorinated silicate glass (FSG), carbon-doped FSG, nitrogen-doped FSG, Z3MS, XLK, and hydrogen silsesqioxane (HSQ). The dielectric constant should be less than about 3.5.

Figure 2A:
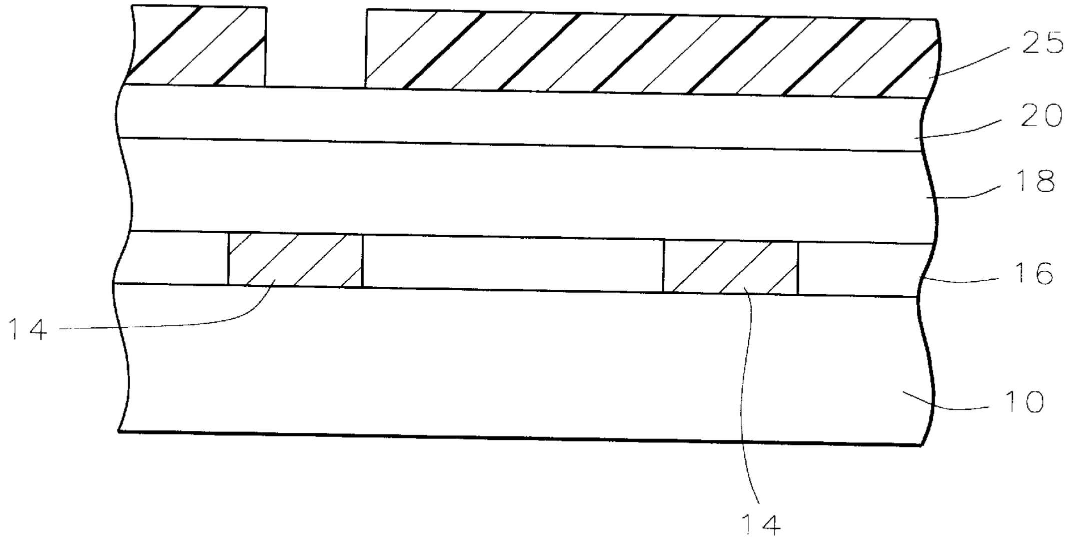
FIGS. 2A and 2B illustrate two alternatives in the preferred embodiment of the present invention.
Figure 3:
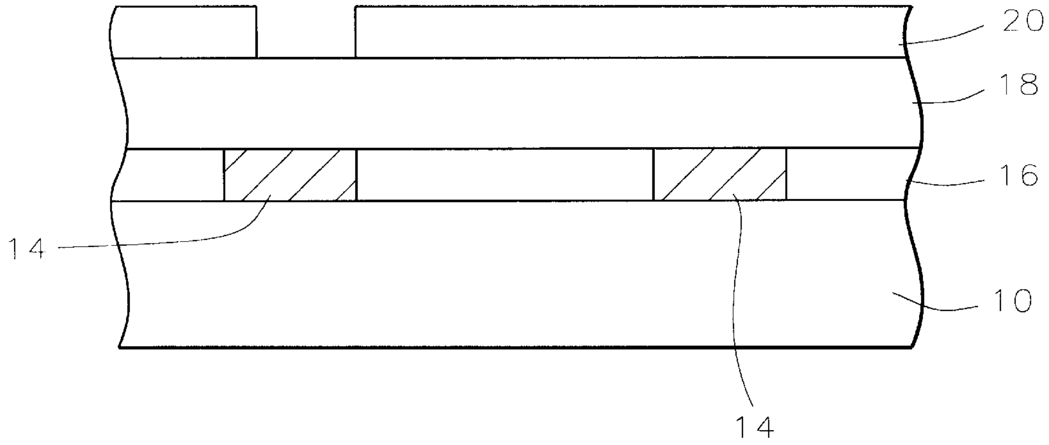

Referring now to FIG. 2A, a first alternative embodiment will be described. A photoresist layer is coated over the second dielectric layer 20 and patterned to form a photoresist mask 25 for the via pattern. The second dielectric layer 20 is etched where it is not covered by the photoresist mask 25 to form the via pattern, as shown in FIG. 3. The photoresist mask 25 is removed.

Figure 2B:
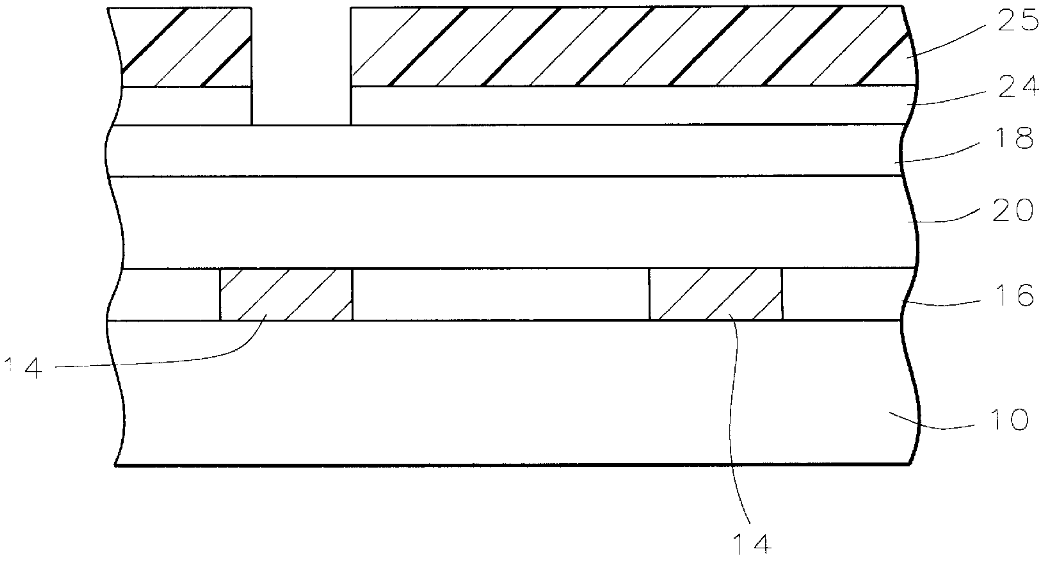

Referring now to FIG. 2B, a second alternative embodiment will be described. In this alternative, the first layer 20 is inorganic, and the second layer 18 is organic, as shown in FIG. 2B. A hard mask layer 24 is deposited over the second dielectric layer. The hard mask layer may comprise silicon oxynitride, silicon oxide, or silicon nitride and have a thickness of between about 500 and 5000 Angstroms. The hard mask layer is necessary when the top dielectric layer is organic to prevent the photoresist removal step from removing also the dielectric layer. In addition, the hard mask layer eliminates photoresist poisoning of the low dielectric constant organic dielectric layer. It is not necessary to use a hard mask when the top dielectric layer is inorganic, as in FIG. 2A.

A photoresist layer is coated over the hard mask layer 24 and patterned to form a photoresist mask 25 for the via pattern. The hard mask layer 24 is etched where it is not covered by the photoresist mask 25 to form the via pattern. The photoresist mask 25 is removed. Then, the second dielectric layer 18 is etched where it is not covered by the hard mask 24 to form the via pattern as shown in FIG. 3. The hard mask layer 24 is stripped.

Both alternatives result in the via pattern's being transferred to the second dielectric layer, as shown in FIG. 3. FIG. 3 and the following figures illustrate the alternative in which the inorganic dielectric layer 20 overlies the organic dielctric layer 18. It will be understood that processing would be the same in the case of the alternative illustrated in FIG. 2B where the organic layer 18 overlies the inorganic layer 20.

Figure 4:
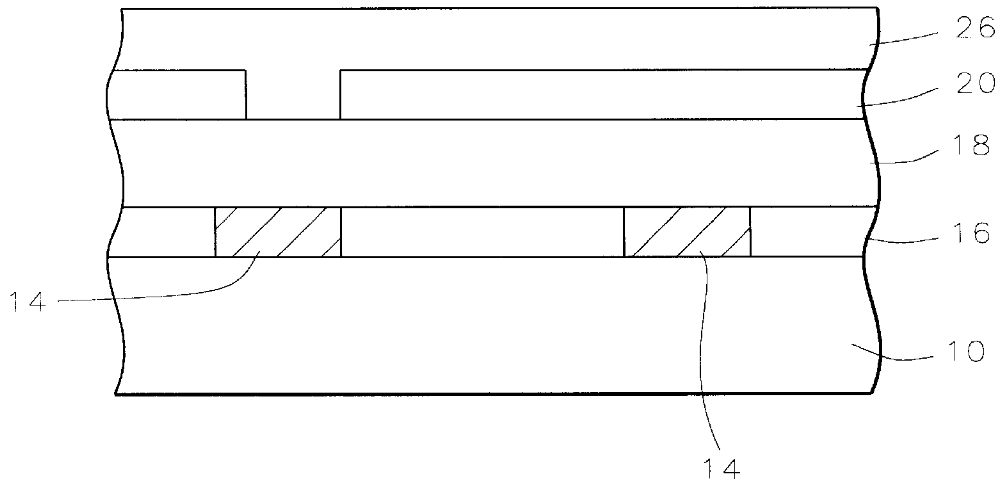

Continuing now with the preferred embodiment of the invention, a third dielectric layer 26 is deposited over the patterned second dielectric layer 20 to a thickness of between about 2000 and 20,000 Angstroms, as shown in FIG. 4. If the underlying dielectric layer is inorganic, as shown, this dielectric layer 26 comprises a low dielectric constant organic material, such as polyimides, HOSP, SILK, FLARE, BCB, MSQ, or any organic polymers. If the underlying dielectric layer is organic, as in FIG. 2B, this dielectric layer 26 comprises a low dielectric constant inorganic material, such as Black Diamond, CORAL, FSG, carbon-doped FSG, nitrogen-doped FSG, Z3MS, XLK, and HSQ.

Figure 5:
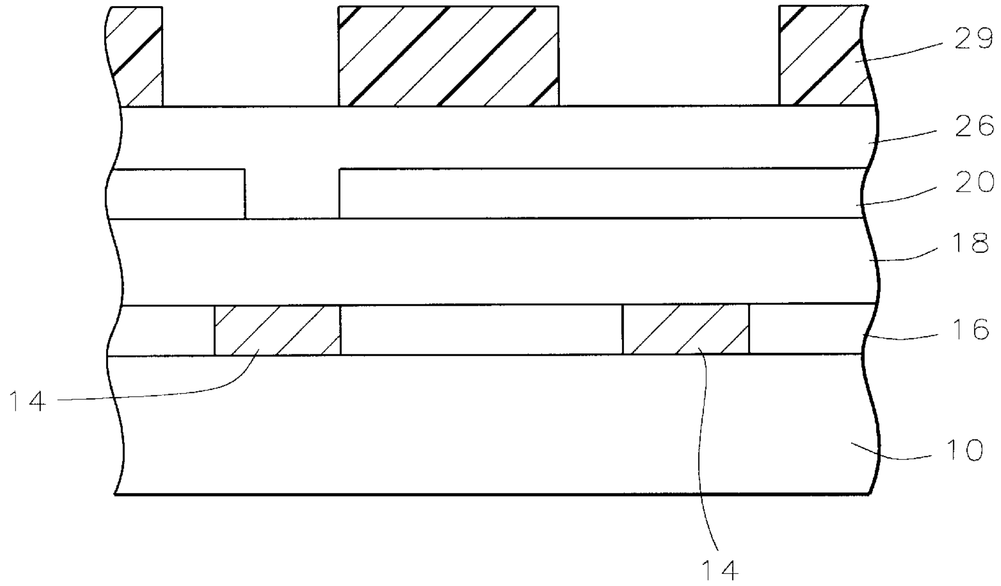

Referring now to FIG. 5, a second photoresist layer is coated over the third dielectric layer 26 and patterned to form the photoresist mask 29 having a trench pattern. If the third dielectric layer 26 is organic, a hard mask, not shown, must be used underlying the photoresist layer so that photoresist removal will not damage the organic layer.

Figure 6:
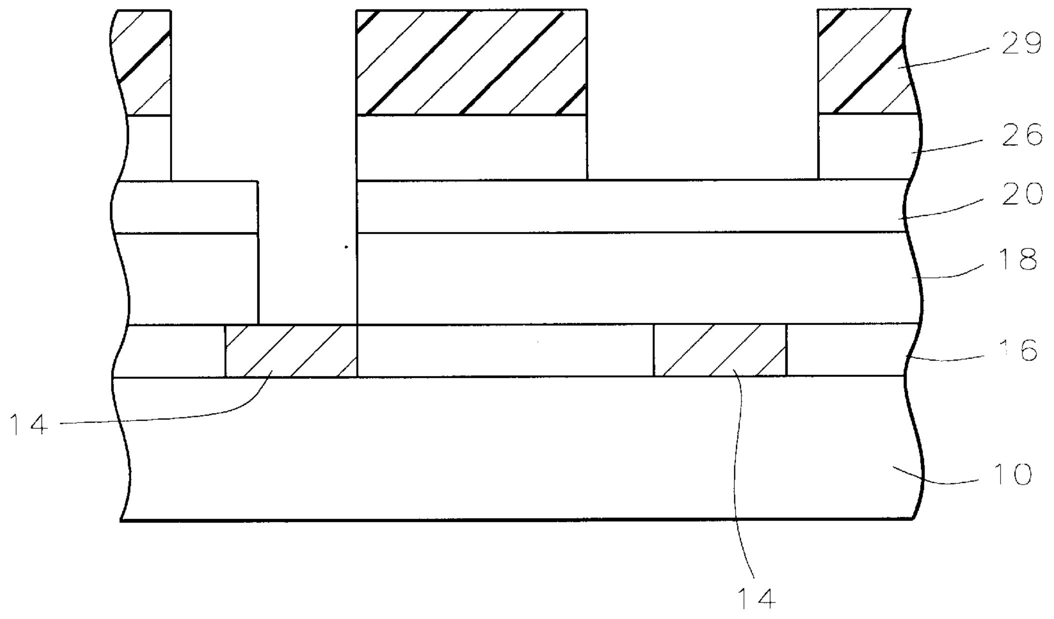

The third and first dielectric materials are etched to form simultaneously both the trench and the via portions of the dual damascene opening, as shown in FIG. 6. Since both the first and third dielectric materials are of the same type, the etching recipe is chosen to etch these materials with a high selectivity to the second dielectric material. In this way, the second dielectric material acts as an etch stop.

Figure 7:
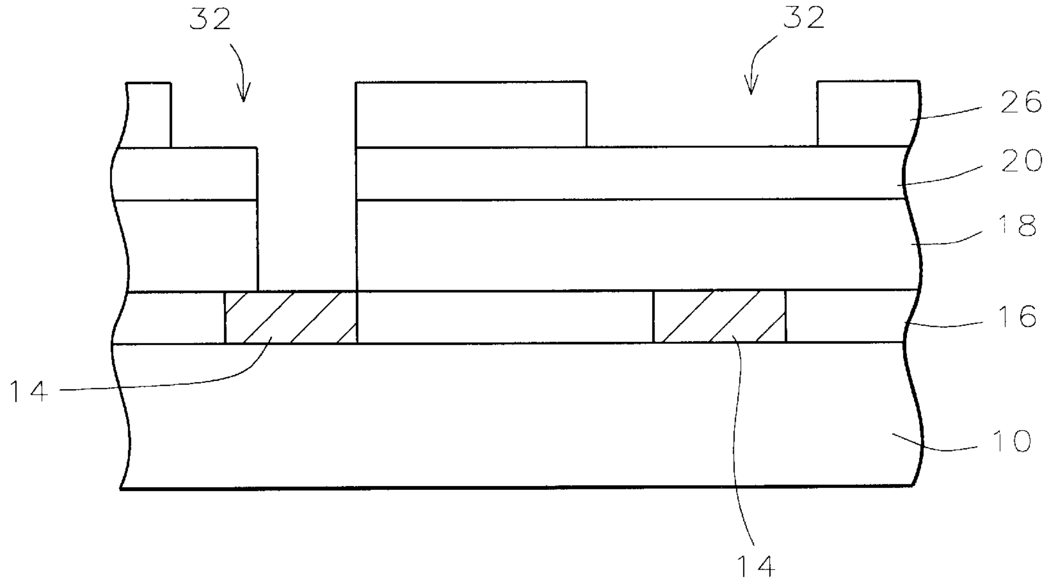

The photoresist mask 29 is removed, leaving the completed dual damascene openings 32, shown in FIG. 7. If a hard mask was used, this is removed also. The process of the invention has formed the dual damascene openings using a triple layer of low dielectric constant materials. No high dielectric constant material was used as an etch stop. Therefore, low capacitance is maintained.

Figure 8:
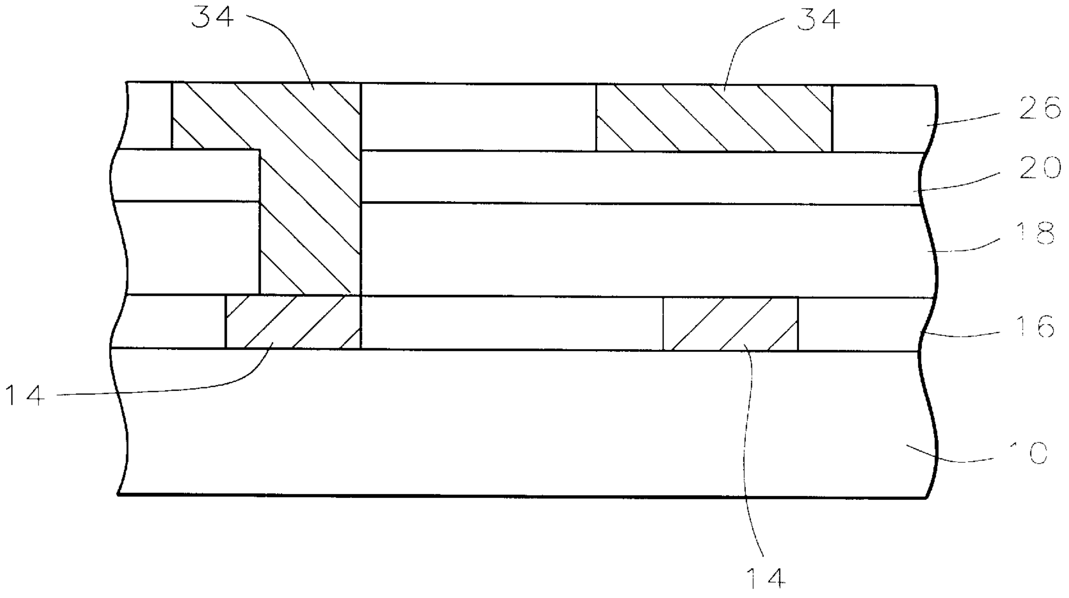

Processing continues as is conventional in the art to fill the damascene openings 32. For example, a barrier metal layer, not shown, is typically deposited over the third dielectric layer and within the openings. A metal layer, such as copper, is formed within the openings, such as by sputtering, electroless plating, or electroplating, for example. The excess metal may be planarized to complete the metal fill 34, as shown in FIG. 8.

The process of the present invention provides a simple and manufacturable dual damascene process where only low dielectric constant materials are used. No high dielectric constant materials are required as etch stops. The process of the invention uses a novel triple layer of low dielectric constant materials to form dual damascene openings in the manufacture of integrated circuits. The novel triple layer of low dielectric constant materials comprises a first and third layer of inorganic material with an organic material therebetween or a first and third layer of organic material with an inorganic material therebetween.

While the invention has been particularly shown and described with reference to the preferred embodiments thereof, it will be understood by those skilled in the art that various changes in form and details may be made without departing from the spirit and scope of the invention.

What is claimed is:

1. A method of forming dual damascene openings in the fabrication of an integrated circuit device comprising:

providing metal lines covered by an insulating layer overlying a semiconductor substrate;

depositing a first dielectric layer of a first type overlying said insulating layer;

depositing a second dielectric layer of a second type overlying said first dielectric layer;

etching a via pattern into said second dielectric layer;

thereafter depositing a third dielectric layer of said first type overlying patterned said second dielectric layer; and simultaneously etching a trench pattern into said third dielectric layer and etching said via pattern into said first dielectric layer to complete said forming of said dual damascene openings in the fabrication of said integrated circuit device.

2. The method according to claim 1 further comprising forming semiconductor device structures including gate electrodes and source and drain regions in and on said semiconductor substrate wherein said metal lines overlie and contact said semiconductor device structures.

3. The method according to claim 1 wherein said first type dielectric layer comprises a low dielectric constant organic material comprising one of the group containing: polyimides, HOSP, SILK, FLARE, BCB, methylsilsesquioxane (MSQ), and any organic polymers.

4. The method according to claim 3 wherein said second type dielectric layer comprises a low dielectric constant inorganic material comprising one of the group containing: Black Diamond, CORAL, fluorinated silicate glass (FSG), carbon-doped FSG, nitrogen-doped FSG, Z3MS, XLK, and hydrogen silsesqioxane (HSQ).

5. The method according to claim 3 further comprising depositing a hard mask overlying said third dielectric layer before said step of simultaneously etching said trench pattern into said third dielectric layer and etching said via pattern into said first dielectric layer wherein said hard mask layer is used as a mask in said etching step.

6. The method according to claim 5 wherein said hard mask layer comprises one of the group containing: silicon oxide, silicon oxynitride, and silicon nitride.

7. The method according to claim 1 wherein said first type dielectric layer comprises a low dielectric constant inorganic material comprising one of the group containing: Black Diamond, CORAL, fluorinated silicate glass (FSG), carbon-doped FSG, nitrogen-doped FSG, Z3MS, XLK, and hydrogen silsesqioxane (HSQ).

8. The method according to claim 7 wherein said second type dielectric layer comprises a low dielectric constant organic material comprising one of the group containing: polyimides, HOSP, SILK, FLARE, BCB, methylsilsesquioxane (MSQ), and any organic polymers.

9. The method according to claim 7 further comprising depositing a hard mask overlying said second dielectric layer before said step of etching said via pattern into said second dielectric layer wherein said hard mask layer is used as a mask in said step of etching said second dielectric layer.

10. The method according to claim 9 wherein said hard mask layer comprises one of the group containing: silicon oxide, silicon oxynitride, and silicon nitride.

11. A method of metallization in the fabrication of an integrated circuit device comprising:

providing metal lines covered by an insulating layer overlying a semiconductor substrate;

depositing a first inorganic dielectric layer overlying said insulating layer;

depositing a second organic dielectric layer overlying said first inorganic dielectric layer;

depositing a hard mask layer overlying said second organic dielectric layer and etching a via pattern into said hard mask layer;

etching said via pattern into said second organic dielectric layer using patterned said hard mask layer as a mask;

removing said hard mask layer;

thereafter depositing a third inorganic dielectric layer overlying patterned said second organic dielectric layer;

simultaneously etching a trench pattern into said third inorganic dielectric layer and etching said via pattern into said first inorganic dielectric layer to form dual damascene openings; and filling said dual damascene openings with a metal layer to complete said metallization in the fabrication of said integrated circuit device.

12. The method according to claim 11 further comprising forming semiconductor device structures including gate electrodes and source and drain regions in and on said semiconductor substrate wherein said metal lines overlie and contact said semiconductor device structures.

13. The method according to claim 11 wherein said first and third inorganic dielectric layers comprise one of the group containing: Black Diamond, CORAL, fluorinated silicate glass (FSG), carbon-doped FSG, nitrogen-doped FSG, Z3MS, XLK, and hydrogen silsesqioxane (HSQ).

14. The method according to claim 11 wherein said second organic dielectric layer comprises one of the group containing: polyimides, HOSP, SILK, FLARE, BCB, methylsilsesquioxane (MSQ), and any organic polymers.

15. The method according to claim 11 wherein said hard mask layer comprises one of the group containing:

silicon oxide, silicon oxynitride, and silicon nitride.

16. A method of metallization in the fabrication of an integrated circuit device comprising:

providing metal lines covered by an insulating layer overlying a semiconductor substrate;

depositing a first organic dielectric layer overlying said insulating layer;

depositing a second inorganic dielectric layer overlying said first organic dielectric layer;

etching a via pattern into said second inorganic dielectric layer;

thereafter depositing a third organic dielectric layer overlying patterned said second inorganic dielectric layer;

depositing a hard mask layer overlying said third organic dielectric layer and etching a trench pattern into said hard mask layer;

simultaneously etching said trench pattern into said third organic dielectric layer using said hard mask layer as a mask and etching said via pattern into said first organic dielectric layer using said patterned second inorganic dielectric layer as a mask to form dual damascene openings;

removing said hard mask layer; and filling said dual damascene openings with a metal layer to complete said metallization in the fabrication of said integrated circuit device.

17. The method according to claim 16 further comprising forming semiconductor device structures including gate electrodes and source and drain regions in and on said semiconductor substrate wherein said metal lines overlie and contact said semiconductor device structures.

18. The method according to claim 16 wherein said first and third organic dielectric layers comprise one of the group containing: polyimides, HOSP, SILK, FLARE, BCB, methylsilsesquioxane (MSQ), and any organic polymers.

19. The method according to claim 16 wherein said second inorganic dielectric layer comprises one of the group containing: Black Diamond, CORAL, fluorinated silicate glass (FSG), carbon-doped FSG, nitrogen-doped FSG, Z3MS, XLK, and hydrogen silsesqioxane (HSQ).

20. The method according to claim 16 wherein said hard mask layer comprises one of the group containing: silicon oxide, silicon oxynitride, and silicon nitride.

* * * * *